United States Patent [19]

Hoda

[11] 4,414,281
[45] Nov. 8, 1983

[54] GLASS-CERAMIC ARTICLES HAVING METALLIC SURFACES

[75] Inventor: Syed N. Hoda, Horseheads, N.Y.

[73] Assignee: Corning Glass Works, Corning, N.Y.

[21] Appl. No.: 349,000

[22] Filed: Feb. 16, 1982

[51] Int. Cl.$^3$ .............................................. C03C 3/22
[52] U.S. Cl. ................................... 428/433; 428/432; 428/450; 428/469; 428/702; 501/3; 501/59; 501/69; 252/508; 252/509; 252/514
[58] Field of Search ............... 428/432, 433, 450, 469, 428/702; 501/3, 59, 69; 252/508, 509, 514

[56] References Cited

U.S. PATENT DOCUMENTS

| | | | |
|---|---|---|---|
| 3,420,645 | 1/1969 | Hair | 501/68 |
| 3,464,806 | 9/1969 | Seki et al. | 501/69 |
| 3,756,838 | 9/1973 | Beall | 501/59 |
| 3,802,892 | 4/1974 | Pirooz | 501/59 |
| 3,892,904 | 7/1975 | Tanaka | 428/210 |

Primary Examiner—Marion McCamish
Assistant Examiner—E. Rollins Buffalow
Attorney, Agent, or Firm—C. S. Janes, Jr.

[57] ABSTRACT

This invention is directed to the production of composite articles composed of a substrate consisting of a machinable glass-ceramic and an integral, electrically-conductive surface layer consisting of metallic copper and/or silver. The inventive articles are prepared by heat treating precursor glass bodies containing copper and/or silver ions to grow fluormica crystals therein, thereby producing glass-ceramics, and to cause migration of the copper and/or silver ions to the surface thereof which are reduced to metallic copper and/or silver via heat treating in a reducing atmosphere. Where desired, holes can be bored, drilled, or punched into the glass-ceramic prior to exposure to the reducing heat treatment such that, upon heat treatment in a reducing environment, the sides of the holes will become metal plated.

2 Claims, No Drawings

GLASS-CERAMIC ARTICLES HAVING METALLIC SURFACES

BACKGROUND OF THE INVENTION

The preparation of glass-ceramic articles exhibiting the capability of being sawed, drilled, punched, or otherwise shaped with hand or machine tools is known to the art. Those articles have contained synthetic micas, commonly termed fluormicas or fluorphlogopites, as the predominant crystal phase. Naturally-occurring micas are usually hydroxyl silicates. The micas developed synthetically have typically contemplated replacing the hydroxyl groups within the crystal lattice of the mica with fluorine. Customarily, the fluormica crystals generated in situ in glass-ceramic articles have been fine-grained and, as such, do not demonstrate the single crystal flexibility frequently exhibited by naturally-occurring micas. However, the synthetic products can display excellent dielectric properties, thermal stability, and mechanical machinability.

The production of fluormica-containing, manually-machinable glass-ceramic bodies was first disclosed in U.S. Pat. No. 3,689,293. The articles described therein consisted essentially, expressed in terms of weight percent on the oxide basis, of about 25–60% $SiO_2$, 15–35% $R_2O_3$, wherein $R_2O_3$ consists of 3–15% $B_2O_3$ and 5–25% $Al_2O_3$, 2–20% $R_2O$, wherein $R_2O$ consists of 0–15% $Na_2O$, 0–15% $K_2O$, 0–15% $Rb_2O$, and 0–20% $Cs_2O$, 4–20% F, and 6–25% $MgO+Li_2O$, consisting of 4–25% MgO and 0–7% $Li_2O$.

X-ray diffraction analyses of the crystals indicated a basic mica structure composed of a fluorophlogopite solid solution, this solid solution being hypothesized to include three components, i.e., normal fluorophlogopite, $KMg_3AlSi_3O_{10}F_2$, boron fluorophlogopite, $KMg_3BSi_3O_{10}F_2$ and a subpotassic aluminous phlogopite believed to approximate $K_{0.5}Mg_2Al_{0.83}BSi_3O_{10}F_2$.

U.S. Pat. No. 3,756,838 describes the production of glass-ceramic articles wherein an alkali metal-free fluormica comprises the predominant crystal phase. The compositions therefor consist essentially, expressed in terms of weight percent on the oxide basis, of about 30–65% $SiO_2$, 5–26% $Al_2O_3$, 10–35% MgO, 3–15% F, and 3–30% RO, wherein RO consists of 3–30% SrO and 0–25% BaO. Up to several percent individually of a number of metal oxides may optionally be present, but the total amount thereof will not exceed 10% by weight. Those possible additions were selected from the group of $As_2O_3$, $B_2O_3$, BeO, CaO, $Fe_2O_3$, $La_2O_3$, MnO, PbO, $P_2O_5$, $Sb_2O_3$, $SnO_2$, $TiO_2$, ZnO, and $ZrO_2$. $K_2O$, $Rb_2O$, and $Cs_2O$ will be avoided because of their ready substitution for BaO and SrO.

The products exhibited the capability of being manually machined and contained fluormica solid solutions varying between about $RMg_{2.5}AlSi_3O_{10}F_2$ and $R_{0.5}MgAlSi_3O_{10}F_2$. The presence of $Sr^{+2}$ ions was found to be necessary in the initial batch to stabilize precursor glass formation. Hence, the total substitution of $Ba^{+2}$ ions for $Sr^{+2}$ was observed to cause the melt to quickly and spontaneously devitrify during cooling to a glass body.

Where less than 5% by weight BaO was present in the composition, the resulting glass-ceramic bodies swelled when contacted with water, leading to the subsequent disintegration thereof. Furthermore, SrO-containing fluormica glass-ceramics and their intermediates with BaO additions demonstrated a great tendency to develop cracks when the parent glass body was heat treated to effect crystallization in situ. Hence, almost invariably the articles developed concentric cracks during heat treatment, the origin of which is not well understood.

U.S. application Ser. No. 349,001, filed concurrently herewith by the present applicant and entitled "Calcium Fluorophlogopite Glass-Ceramics", discloses the preparation of mechanically-machinable, alkali metal-free, glass-ceramic articles wherein the predominant crystal phase is a calcium fluorophlogopite. The base compositions therefor consist essentially, expressed in terms of weight percent on the oxide basis, of about 5–20% CaO, 15–25% MgO, 5–20% $Al_2O_3$, 35–60% $SiO_2$, and 5–15% F which are nucleated with 0.5–3.5% BaO+SrO, consisting of 0–3.5% BaO and 0–2.5% SrO, or, if BaO and/or SrO are absent, then with 8–15% $TiO_2$.

The alkali metal-free products demonstrate dielectric properties much superior to those glass-ceramic bodies containing "conventional" fluorophlogopites. Moreover, the alkaline earth metal-containing fluormica glass-ceramics have appeared to be mechanically stronger than those bodies wherein alkali metal-containing fluormicas constitute the predominant crystal phase.

Composite articles composed of a substrate of dielectric material, at least one surface of which has an electrically conductive metallic coating thereon, are known to the art for such applications as printed circuit boards. For example, copper clad, epoxy-glass fiber laminates have been widely used for printed circuit boards, and boards utilizing an alumina substrate have been employed where higher temperatures are to be encountered. Because of the inherent high cost of sintered alumina substrates and the difficulty encountered in forming complex shapes thereof, glass and glass-ceramic substrates have also been used in high temperature applications. In the main, the boards utilized commercially have contemplated bonding the metal surface layer to the substrate.

It has been appreciated that a conductive metallic layer integral with the substrate would possess the intrinsic advantages of a very high bonding strength, freedom from concern regarding delamination during soldering or repairing or other surface defect in the bonding of the metal to the substrate, and good control over the depth of the conductive layer. Research has been conducted in the past to develop integral surface films on glass and glass-ceramic articles. This research has been based upon the phenomenon of metal migration to the surface upon heating the article. Illustrations of this research include:

U.S. Pat. No. 3,231,456 describes the production of glass-ceramic articles having integral surface layers of copper, gold, or silver via heat treating base glass compositions in the $Li_2O$-MgO-$Al_2O_3$-$SiO_2$-$P_2O_5$ and $Li_2O$-ZnO-$SiO_2$-$P_2O_5$ systems containing copper, gold, or silver compounds in a reducing atmosphere.

U.S. Pat. No. 3,420,645 is concerned with the manufacture of hollow glass particles from alumino-silicate base compositions and having an integral surface layer of metallic copper. The mechanism involved in the development of the surface layer is expressly stated to be the migration of copper ions in the interior of the glass bodies to the surface as they are heated in a reducing environment.

U.S. Pat. No. 3,464,806 discloses the preparation of glass-ceramic bodies having integral metallic surface layers of copper and/or silver by heat treating in a reducing atmosphere glass bodies having compositions selected from the group of $Li_2O$, $MgO$, $Al_2O_3$, and $SiO_2$, and $Li_2O$, $MgO$, $Al_2O_3$, $SiO_2$, and F which are nucleated with $TiO_2$ and/or $ZrO_2$ and contain $Ag_2O$ and/or $Cu_2O$.

U.S. Pat. No. 3,490,887 teaches heat treating in a reducing atmosphere a ferroelectric glass-ceramic body containing cuprous oxide, wherein the internal crystal phase is selected from the group of titanates, niobates, tantalates, and zirconates of Group I and Group II elements and mixtures thereof, to cause the migration of cuprous ions to the surface of the body and the reduction thereof to metallic copper.

U.S. Pat. No. 3,790,360 discusses the production of glass-ceramic bodies having integral surface layers of metallic copper or silver by heat treating in a reducing atmosphere a copper or silver-containing glass having a base composition selected from the group of $Li_2O$-$Al_2O_3$-$SiO_2$, $Li_2O$-$Al_2O_3$-$MgO$-$SiO_2$, $Li_2O$-$MgO$-$CaO$-$Al_2O_3$-$SiO_2$, and $MgO$-$CaO$-$Al_2O_3$-$SiO_2$, which is nucleated with $TiO_2$ and/or $ZrO_2$ and/or $P_2O_5$ and/or F.

U.S. Pat. No. 3,802,892 involves making glass-ceramic articles having integral copper surface layers by heat treating in a reducing atmosphere base glasses having compositions selected from the group of $Na_2O$-$K_2O$-$Al_2O_3$-$SiO_2$-$TiO_2$-$CuO$, $Na_2O$-$K_2O$-$CaO$-$Al_2O_3$-$SiO_2$-$TiO_2$-$CuO$, and $Al_2O_3$-$SiO_2$-$TiO_2$-$ZrO_2$-$CuO$.

U.S. Pat. No. 3,876,407 describes the manufacture of metal-coated glass-ceramic articles from glass articles having base compositions in the $Al_2O_3$-$SiO_2$ system containing copper and/or silver compounds. The surface of the glass articles is covered with a substance containing copper and/or silver. Thereafter, the coated glass article is heat treated to convert the glass to a glass-ceramic and to cause the copper and/or silver ions therein to migrate to the surface to thereby form a metallic layer of increased thickness.

U.S. Pat. No. 3,892,904 is directed to the preparation of glass-ceramic articles having a metallic coating in localized areas on the surfaces thereof. The method comprises contacting a molten mass of glass which is capable of being converted into a glass-ceramic with another molten mass of a glass which is likewise convertible into a glass-ceramic, but which also contains a copper and/or a silver compound, forming the resulting mass into a glass article, and thereafter heat treating the glass article in a reducing atmosphere to cause the glass to crystallize in situ and to cause the migration of copper and/or silver ions to the surface of the final article in that portion thereof resulting from the glass which initially contained the copper and/or silver compound.

U.S. Pat. No. 4,084,972 describes the production of glass-ceramic articles having a surface layer of alpha-iron crystals. A base glass containing an iron compound is first crystallized in situ in an oxidizing atmosphere to develop a glass-ceramic having an integral surface layer of hematite, following which the glass-ceramic body is fired in a dry reducing atmosphere to convert the hematite to alpha-iron.

U.S. Pat. No. 4,198,466 is concerned with the making of glass-ceramic articles having internal crystallization of beta-spodumene solid solution and an integral surface layer of cobalt-iron, nickel-iron, or cobalt-nickel-iron crystals. Yet again, the surface layer results from the migration of cobalt, nickel, and iron ions to the surface where they are reduced to metals during a heat treatment in a reducing environment.

Although it is apparent from the above illustrations that considerable research has been conducted to produce integral metallic films on the surface of glass-ceramic articles, there is no evidence of any attempt to prepare such products utilizing a machinable glass-ceramic as the substrate body. It requires a complex and multiple-step process to produce metal plated through holes in the conventional printed circuit boards. Moreover, such products are limited to plastic laminates because alumina substrates are too brittle to have holes bored, drilled, punched, or otherwise made therein. Alumina, therefore, is used only for one-sided printed circuitry. In contrast, the use of a machinable glass-ceramic as a substrate material would permit the easy fabrication of articles of complex geometry and would offer the capability of producing holes, the sides of which would be metal plated.

Accordingly, the prinicpal objective of this invention is to provide machinable glass-ceramic bodies having integral, electrically conductive surface films thereon and a method for making them. A practical objective of this invention is to provide printed circuit boards fabricated from machinable glass-ceramic materials having holes therein plated with integral, electrically conductive films.

SUMMARY OF THE INVENTION

Those objectives can be achieved in glass-ceramic articles containing copper and/or silver and having a synthetic fluormica as the predominant and, desirably, sole crystal phase, said fluormica being of the type capable of imparting mechanical machinability to the articles. In the most general terms, the inventive articles are prepared via a four-step method:

(1) a batch for a glass of the proper composition containing an effective amount of a copper and/or silver compound is compounded and melted;

(2) the melt is simultaneously cooled to a temperature at least within and, preferably, below the transformation range thereof and a glass article of a desired configuration shaped therefrom;

(3) the glass article is exposed to a temperature between about 700°–1200° C. for a period of time sufficient to cause the growth of synthetic fluormica crystals in situ, thereby producing a glass-ceramic body, and to effect migration of copper and/or silver ions to the surface thereof; and then (4) the glass-ceramic body is exposed to a dry reducing environment at a temperature between about 500°–1000° C. for a period of time sufficient to reduce the copper and/or silver ions in said surface to metallic copper and/or silver.

Products having the desired integral, electrically-conductive surface layers of metallic copper or silver can be prepared from specific regimes of glass compositions within three base systems, viz., normal fluorophlogopite, alkali metal boron fluorophlogopite, and alkaline earth metal fluorophlogopite. Because of the significantly better dielectric properties manifested by products essentially free from alkali metals, the alkaline earth metal phlogopites are much preferred as substrates in such electrical applications as printed circuit boards. Moreover, the mechanical strengths of the alkaline earth metal fluormica-containing glass-ceramic articles are generally greater than those demonstrated by the alkali metal-containing bodies.

Compositions tracking the stoichiometric formulations are operable. However, glass compositions somewhat off stoichiometry, thereby resulting in additional glassy phase in the glass-ceramic articles, are useful in improving glass stability, i.e., inhibiting the possibility of devitrification during working and forming of the glass melt. The presence of such additional glassy phase does not appear to deleteriously affect the dielectric properties of the materials. Excessive glassy phase will, of course, adversely affect the machinable character of the glass-ceramic.

The amount of copper and/or silver effective to promote sufficient migration to the surface of the glass-ceramic to form a continuous, integral film thereon is somewhat dependent upon the composition of the substrate material. In general, at least about 1% by weight, calculated as the oxide, will be present. Because of the inherent high cost of copper and silver, practicality demands that only an amount required to insure a sound surface layer be incorporated into the initial glass batch. Therefore, whereas copper and silver added to the batch in the form of oxides in quantities exceeding 6% by weight will be effective and will not seriously degrade the desired mechanical and electrical properties of the glass-ceramic, no significant advantage has been observed in the use of such levels and additions up to 6% by weight, calculated as the oxide, have been deemed practical maxima.

The most preferred glass compositions will consist essentially, expressed in terms of weight percent on the oxide basis, of about 6–22% MgO, 10–18% $MgF_2$, an effective amount up to 6% $Cu_2O$ and/or $Ag_2O$, 0–14% $K_2O$, 0–16% BaO, 0–12% SrO, 0–10% CaO, 0–22% $Al_2O_3$, 0–18% $B_2O_3$, and 30–47% $SiO_2$.

It will be appreciated that the fluoride content is expressed in terms of $MgF_2$ merely because that is the component by which fluoride was incorporated into the glass batch. It is apparent that the fluoride could be added to the glass compositions via other compounds, e.g. $AlF_3$, $BaF_2$, $CaF_2$, $SrF_2$, etc. Accordingly, the operable range of fluoride is the equivalent of that present in 10–18% $MgF_2$.

Other compatible oxides may be added which do not significantly alter the desired glass stability and/or physical properties of the final product. The glasses do not demand a nucleating agent to initiate crystallization, but such well-known crystallization promoters as $SnO_2$, $TiO_2$, and/or $ZrO_2$ may be included. Nevertheless, the sum of all such extraneous additions ought not to exceed about 10% by weight.

As is well-recognized in the glass-ceramic art the crystallization of the precursor glass body is time and temperature dependent. Thus, crystallization proceeds more rapidly at higher temperatures such that only a relatively brief exposure period at the upper extreme of the crystallization range will be adequate, but many hours longer may be demanded at the cooler end thereof. Furthermore, although not mandatory with the inventive compositions, to aid in obtaining crystals of more uniform dimensions, the parent glass body may be initially subjected to a nucleation treatment, i.e., exposed to temperature slightly above the transformation range thereof for a sufficient length of time to cause the development of many nuclei dispersed throughout the glass which provide sites for the subsequent growth of crystals. The presence of this myriad of nuclei limits the size of the crystals grown, because many more sites are available to initiate crystal growth and the crystals can only develop to a certain size before coming into contact with adjacent crystals. With the inventive compositions the nucleation treatment will be conducted at temperatures between about 625°–800° C., depending upon the base glass composition. In general, dwell periods within that temperature interval of about 1–6 hours will be adequate. However, as was noted previously, a nucleation step is not a required element of the crystallization process.

The microstructure and mechanical strength of the final products are substantively influenced by the temperature of the crystallization heat treatment employed. To illustrate, where the top crystallization temperature utilized is relatively low, e.g., less than 1000° C. and, generally, no higher than 900° C., the resulting body is very highly crystalline and the crystals are fine-grained. However, the mechanical strength of the body will be relatively low, perhaps exhibiting a modulus of rupture no greater than about 15,000 psi. In contrast, where higher crystallization temperatures are utilized, e.g., greater than 1000° C. and, generally, at least 1100° C., the resulting body is somewhat less highly crystalline, i.e., there is a slightly greater proportion of glassy matrix therein, with the crystals having considerably larger dimensions and the morphology of plates or ribbons with high aspect ratios. The mechanical strength of the body is considerably higher, typically in excess of 20,000 psi. This improvement in strength has been posited to be due to an intertwining or interlocking of the plates or ribbons.

As observed above, the copper oxide and/or silver oxide surface film can be reduced to metallic copper and/or metallic silver via exposure to temperatures within the region of about 500°–1000° C. in the presence of a highly reducing environment. A highly reducing environment can be achieved through dry atmospheres such as hydrogen, cracked $NH_3$, mixtures of CO and $CO_2$, and forming gas (8% $H_2$, 92% $N_2$). Temperatures in excess of 1000° C. may be used but with no significant advantage and such hazard the thermal deformation of the glass-ceramic and/or the softening of the metallic layer.

As can be appreciated, where the precursor glass body can be crystallized in situ at temperatures in the vicinity of 700°–1000° C., crystallization thereof and development of a metallic surface layer thereon can be accomplished in a single-step heat treatment carried out in a reducing atmosphere. Or, if desired, the glass body can first be crystallized in air or other non-reducing or oxidizing environment and an integral oxide surface layer developed. Thereafter, the atmosphere can be changed from air to a reducing gas to convert the oxide film to a metallic layer.

Where holes are desired which will have integral metallic surface films around the sides thereof, the parent glass body will commonly be crystallized to a glass-ceramic, the glass-ceramic drilled to produce holes at predetermined locations, and the body then fired in a reducing environment to develop the metallic surface film.

Examination of the microstructure of the inventive glass-ceramics via X-ray diffraction analysis and electron microscopy has indicated that a departure from the fluorophlogopite stoichiometry to improve glass stability generates a significant amount of residual glass in the alkali metal boron fluorophlogopite compositions, less in the normal fluorophlogopite compositions, and little in the alkaline earth fluorophlogopite compositions. However, due to the high aspect ratio of the fluormica crystals in the alkali metal boron fluorophlogopite glass-ceramics (length-to-width ratio in the vicinity of 20:1) and the high crystallinity in the other two species (greater than 75% by volume and frequently in the vicinity of 90%), the mechanical strengths exhibited by each species exceed a modulus of rupture of 15,000 psi and often 20,000 psi. The presence of copper or silver does not appear to alter the crystallinity or microstructure of the glass-ceramic. It has not been possible to determine whether copper or silver enters the fluormica structure. It is theorized that, if copper or silver should enter the crystal structure, it would be in the interlayer. X-ray diffraction data, however, have failed to provide any supporting evidence for that hypothesis.

An unusual phenomenon observed in the microstructure of the alkali metal boron fluorophlogopite glass-ceramics was the presence of microcracks or gaps at the interface between the glass and the crystals. This characteristic is believed to be due to the mismatch in thermal expansion existing between the fluormica, considered to have a coefficient of thermal expansion (0°–300° C.) probably in excess of $100 \times 10^{-7}$/°C. along the c-axis, and the residual borosilicate glass, deemed to have a coefficient of thermal expansion (0°–300° C.) probably lower than $40 \times 10^{-7}$/°C.

Yet another unusual feature observed in the inventive alkali metal boron fluorophlogopite glass-ceramics is what appears to be spinodal decomposition of copper-containing borosilicate residual glass. Spinodal decomposition is suggested by the connectivity and relative proportions of the two phases. Silver-containing glass-ceramics of like compositions do not appear to exhibit that phenomenon.

Studies of the copper and silver layers utilizing scanning electron micrograph techniques have confirmed the expected, viz., that the ultimate thickness of the surface film is dependent upon the metal content and the heat treatment to which the glass-ceramic is subjected. Hence, a higher level of metal and/or a prolonged heat treatment will commonly produce thicker layers. Those studies also indicated a transition zone existing between the metal surface and the glass-ceramic interior. Moreover, it was observed that, where like amounts of copper and silver were incorporated individually, both the metal layer and the transition zone are thicker with silver additions than with copper additions.

Examination at various steps of the conversion of the oxide film to a metal layer through a series of scanning electron micrographs has led to the conclusion that metal beads form in a thin surface layer during the firing of the glass-ceramic in the reducing atmosphere which coalesce into larger beads as the reduced firing proceeds. When the beads become connected, the resultant surface layer becomes electrically conductive.

The solubility of silver in the inventive compositions appears to be less than that of copper. For example, levels of silver in excess of 2% by weight in certain compositions resulted in silver-containing particles dispersed in the parent glass body. No attempt was made via changes in melting and/or batching techniques, however, to increase the level of silver in those glasses. In general, metal contents of about 5% by weight yielded solid, electrically-conductive layers of about 0.001" (25 microns) thickness.

DESCRIPTION OF PREFERRED EMBODIMENTS

Table I reports a group of compositions, expressed in terms of parts by weight on the oxide basis as calculated from the batch, operable in the instant invention. Because the sum of the individual components totals or closely approximates 100, for all practical purposes the values recited can be deemed to reflect weight percent. Furthermore, inasmuch as it is not known with which cation(s) the fluorine is combined, it is merely recorded in terms of $MgF_2$, the batch constituent employed to incorporate the fluorine into the body. It will be appreciated, of course, that other compounds, such as $AlF_3$, $BaF_2$, and $SrF_2$, may be utilized as a fluorine-containing batch material.

The batch ingredients were compounded, ballmilled together to aid in achieving a homogeneous melt, placed into platinum crucibles, lids positioned on the crucibles, and the covered crucibles moved into a furnace operating at 1450° C. After a period of 5 hours, the melts were poured into steel molds to produce slabs 6"×6"×¼" or poured through steel rollers to form ⅛" thick sheets. The copper-containing glasses exhibited either a transparent, dark green appearance or formed a pastel green opal. The silver-containing glasses typically demonstrated a transparent, yellowish appearance.

$As_2O_3$ was added to perform its normal function as a fining agent. Its inclusion also appeared to improve the solubility of silver in the inventive glasses.

TABLE I

|  | 1 | 2 | 3 | 4 | 5 | 6 | 7 | 8 |
|---|---|---|---|---|---|---|---|---|
| $SiO_2$ | 44.5 | 43.5 | 42.6 | 43.2 | 42.8 | 34.3 | 35.2 | 34.5 |
| MgO | 19.9 | 19.5 | 19.1 | 19.3 | 19.1 | 9.8 | 6.8 | 11.8 |
| $MgF_2$ | 15.4 | 15.1 | 14.8 | 15.0 | 14.8 | 14.7 | 14.7 | 13.8 |
| $K_2O$ | 11.6 | 11.4 | 11.1 | 11.3 | 11.2 | 6.7 | 6.2 | 6.3 |
| $Al_2O_3$ | — | — | — | — | — | 16.7 | 19.6 | 16.8 |
| $B_2O_3$ | 8.6 | 8.4 | 8.2 | 8.3 | 8.3 | 15.7 | 15.6 | 14.8 |
| $Ag_2O$ | — | 2.0 | 4.2 | — | — | 2.0 | 2.0 | 2.0 |
| $Cu_2O$ | — | — | — | 2.9 | 3.8 | — | — | — |

|  | 9 | 10 | 11 | 12 | 13 | 14 | 15 | 16 |
|---|---|---|---|---|---|---|---|---|
| $SiO_2$ | 33.3 | 34.3 | 35.2 | 34.5 | 33.3 | 34.5 | 37.7 | 38.6 |
| MgO | 12.5 | 9.8 | 11.8 | 12.5 | | 6.7 | 9.7 | 9.8 |
| $MgF_2$ | 13.7 | 14.7 | 14.7 | 13.8 | 13.7 | 14.4 | 13.4 | 13.6 |
| $K_2O$ | 7.1 | 6.7 | 6.2 | 6.3 | 7.1 | 6.0 | — | — |
| BaO | — | — | — | — | — | — | 13.4 | 13.6 |
| SrO | — | — | — | — | — | — | 9.7 | 9.8 |
| $Al_2O_3$ | 16.7 | 16.7 | 19.6 | 16.8 | 16.7 | 19.2 | 13.1 | 6.6 |
| $B_2O_3$ | 14.7 | 15.7 | 15.6 | 14.8 | 14.7 | 15.3 | — | 5.4 |
| $Ag_2O$ | 2.0 | — | — | — | — | 2.0 | — | — |
| $Cu_2O$ | — | 2.0 | 2.0 | 2.0 | 2.0 | — | 2.9 | 2.9 |

|  | 17 | 18 | 19 |
|---|---|---|---|
| $SiO_2$ | 38.6 | 37.5 | 37.0 |
| MgO | 9.9 | 10.6 | 10.5 |
| $MgF_2$ | 13.8 | 12.2 | 12.0 |
| BaO | 13.8 | 13.3 | 13.2 |
| SrO | 9.9 | 9.7 | 9.5 |
| $Al_2O_3$ | — | 13.2 | 13.1 |
| $B_2O_3$ | 11.1 | — | — |
| $Cu_2O$ | 2.9 | 2.5 | 4.8 |
| $As_2O_3$ | — | 1.0 | — |

Table II reports the visual appearance of the precursor glasses produced from the exemplary compositions of Table I, the heat treatment schedule employed in an electrically-heated furnace for converting those glasses into glass-ceramics, the visual appearance of those glass-ceramics, the reducing heat treatment schedule utilized in an electrically-heated furnace for developing a metallic surface layer on the glass-ceramics, the visual appearance of the metallic surface layer, and various physical properties, where determined on the final product, as measured using methods conventional in the glass-ceramic art. In each heat treatment schedule, the temperature was raised at about 5° C./minute to the stated levels. The crystallized articles were cooled to room temperature by simply cutting off the electric current to the furnace and retaining the articles therein.

treated in accordance with the schedules reported in Table II, are reported below ($\rho$=resistivity, L.T.=loss tangent, D.C.=dielectric constant).

| Temp °C. | Log $\rho$ | 120 Hz L.T. | 120 Hz D.C. | 1 KHz L.T. | 1 KHz D.C. | 10 KHz L.T. | 10 KHz D.C. |
|---|---|---|---|---|---|---|---|
| 25 | — | <0.001 | 7.35 | 0.001 | 7.41 | 0.001 | 7.38 |
| 106 | — | — | 7.65 | 0.001 | 7.44 | 0.001 | 7.44 |
| 204 | 14.71 | — | 7.65 | 0.002 | 7.56 | 0.001 | 7.53 |
| 305 | 12.98 | — | 9.12 | 0.071 | 7.91 | 0.013 | 7.65 |
| 403 | 11.38 | — | 14.12 | 0.217 | 10.44 | 0.108 | 8.21 |
| 502 | 9.89 | — | 23.53 | 0.340 | 15.32 | 0.251 | 10.50 |

TABLE II

| Example | Glass Appearance | Glass-Ceramic Heat Treatment | Glass-Ceramic Appearance | Metallic Surface Heat Treatment | Surface Appearance | Physical Properties |
|---|---|---|---|---|---|---|
| 1 | Transparent, clear | 800° C. for 4 hours 900° C. for 4 hours | Fine-grained, translucent, machinable | 600° C. for 4 hours in forming gas | No change | |
| 2 | Transparent, yellowish | 800° C. for 4 hours 900° C. for 4 hours | Grayish white, fine-grained, machinable | 600° C. for 4 hours in forming gas | Brownish metallic surface | |
| 3 | Transparent, yellow, with silver beads | 800° C. for 4 hours 900° C. for 4 hours | Gray, fine-grained, machinable | 600° C. for 4 hours in forming gas | Submetallic brown surface | |
| 4 | Transparent, bluish green | 800° C. for 4 hours 900° C. for 4 hours | Bluish, fine-grained, hard skin, machinable | 600° C. for 4 hours in forming gas | Chocolate brown metallic surface | |
| 5 | Transparent, green | 800° C. for 4 hours 900° C. for 4 hours | Bluish, fine-grained, hard skin, machinable | 600° C. for 4 hours in forming gas | Dark chocolate brown metallic surface | |
| 6 | Opaque, yellowish | 700° C. for 4 hours 1000° C. for 4 hours | Grayish white surface, white machinable interior | 800° C. for 2 hours + 900° C. for 2 hours in forming gas | Shiny metal film | |
| 7 | Transparent to opaque, yellowish | 700° C. for 4 hours 1000° C. for 4 hours | Pinkish white surface, coarse-grained, machinable interior | 900° C. for 1 hour + 1000° C. for 1 hour in forming gas | Shiny metal film | |
| 8 | Opaque, yellowish | 700° C. for 4 hours 1000° C. for 4 hours | White, fine-grained, machinable | 800° C. for 2 hours + 900° C. for 2 hours in forming gas | Shiny metal film | |
| 9 | Opaque, yellowish | 700° C. for 4 hours 1000° C. for 4 hours | White, fine-grained, machinable | 900° C. for 1 hour + 1000° C. for 1 hour in forming gas | Shiny metal film | |
| 10 | Opaque, light green | 700° C. for 4 hours 1000° C. for 4 hours | Dark green, fine-grained, metallic surface, machinable | 800° C. for 2 hours + 900° C. for 2 hours in forming gas | Shiny metal film | |
| 11 | Transparent, dark green | 700° C. for 4 hours 1000° C. for 4 hours | Dark green, coarse-grained, metallic surface, machinable | 900° C. for 1 hour + 1000° C. for 1 hour in forming gas | Shiny metal film | |
| 12 | Opaque, green | 700° C. for 4 hours 1000° C. for 4 hours | Dark green, fine-grained, metallic surface, machinable | 800° C. for 2 hours + 900° C. for 2 hours in forming gas | Shiny metal film | Modulus of Rupture 13,000 psi |
| 13 | Opaque, green | 700° C. for 4 hours 1000° C. for 4 hours | Dark green, fine-grained, metallic surface, machinable | 800° C. for 1 hour + 1000° C. for 1 hour in forming gas | Shiny metal film | Modulus of Rupture 20,000 psi |
| 14 | Opaque, white | 700° C. for 4 hours 1000° C. for 4 hours | Slightly off white, coarse-grained, highly machinable | 800° C. for 2 hours + 900° C. for 2 hours in forming gas | Shiny metal film | |
| 15 | Transparent, very dark green to black | 1100° C. for 4 hours | Dark gray surface, orange-red interior, fine-grained, highly machinable | 900° C. for 4 hours in forming gas | Shiny metal film | Modulus of Rupture 24,000 psi |
| 16 | Opaque, light green | 1000° C. for 4 hours | Bluish, medium-grained quite deformed | 700° C. for 4 hours in forming gas | Less shiny than Example 15 | |
| 17 | Opaque, light green | 1000° C. for 4 hours | Bluish, medium-grained slightly deformed | 900° C. for 4 hours in forming gas | Shiny metal film | |
| 18 | Transparent, black | 1100° C. for 4 hours | Dark gray metallic surface, fined-grained brown interior | 700° C. for 4 hours in forming gas | Less shiny than Example 17 | |
| 19 | Transparent, black | 1100° C. for 4 hours | Dark gray metallic surface, fined-grained brown interior | 900° C. for 4 hours in forming gas | Shiny metal film | Modulus of Rupture 21,000 psi |

The electrical resistivities of the metallic layers are generally very low, i.e., less than 10 ohms/square and, more desirably, less than 1 ohm/square. To illustrate, the surface resistivity of Example 19, when crystallized and treated in a reducing environment as recorded in Table II, was measured at $10^{-3.21}$ ohms/square. Dielectric properties determined at various temperatures and frequencies on the interior portion of Example 19, as

I claim:

1. A composite article composed of a substrate consisting of a glass-ceramic, wherein the predominant crystal phase is a synthetic fluormica selected from the group of normal fluorophlogopite, alkali metal boron fluorophlogopite, and alkaline earth metal fluorophlogopite, which is mechanically machinable and an integral, electrically-conductive surface layer consisting of metallic copper and/or silver, said glass-ceramic consisting essentially, expressed in terms of weight percent on the oxide basis, of about 6–22% MgO, 10–18% MgF, an effective amount up to 6% $Cu_2O$ and/or $Ag_2O$, 0–14% $K_2O$, 0–16% BaO, 0–12% SrO, 0–10% CaO, 0–22% $Al_2O_3$, 0–18% $B_2O_3$, and 30–47% $SiO_2$.

2. A composite article according to claim 1 wherein the predominant crystal phase present in said glass-ceramic substrate is an alkaline earth metal fluorophlogopite and said glass-ceramic is essentially free from alkali metal oxide.

* * * * *